(12) United States Patent
Vukovic

(10) Patent No.: US 12,105,423 B2
(45) Date of Patent: Oct. 1, 2024

(54) APPARATUS AND METHODS FOR BEAM PROCESSING OF SUBSTRATES

(71) Applicant: Tokyo Electron Limited, Tokyo (JP)

(72) Inventor: Mirko Vukovic, Albany, NY (US)

(73) Assignee: Tokyo Electron Limited, Tokyo (JP)

( * ) Notice: Subject to any disclaimer, the term of this patent is extended or adjusted under 35 U.S.C. 154(b) by 603 days.

(21) Appl. No.: 17/033,489

(22) Filed: Sep. 25, 2020

(65) Prior Publication Data

US 2021/0109450 A1  Apr. 15, 2021

Related U.S. Application Data

(60) Provisional application No. 62/914,160, filed on Oct. 11, 2019.

(51) Int. Cl.
| | |
|---|---|
| *H01J 37/20* | (2006.01) |
| *G03F 7/16* | (2006.01) |
| *H01J 37/317* | (2006.01) |
| *H01L 21/67* | (2006.01) |

(52) U.S. Cl.
CPC .............. *G03F 7/168* (2013.01); *G03F 7/162* (2013.01); *H01J 37/20* (2013.01); *H01J 37/3174* (2013.01); *H01L 21/67069* (2013.01); *H01J 2237/20214* (2013.01); *H01J 2237/31774* (2013.01)

(58) Field of Classification Search
CPC ...... H01J 37/20; H01J 37/305; H01J 37/3053; H01J 2237/202
USPC ....................................................... 264/485
See application file for complete search history.

(56) References Cited

U.S. PATENT DOCUMENTS

| | | |
|---|---|---|
| 6,506,688 B2 | 1/2003 | Wu |
| 8,183,500 B2 | 5/2012 | Harte et al. |
| 2007/0039709 A1* | 2/2007 | Endo ............... B22D 18/06 164/76.1 |

(Continued)

FOREIGN PATENT DOCUMENTS

| | | |
|---|---|---|
| DE | 19536474 A1 | 4/1997 |
| JP | 2014504004 A | 2/2014 |

OTHER PUBLICATIONS

Sobhan, Amoolya et al., "Electron Beam Technique for Controlled Metal Removal," An Analysis Journal of Harmonized Research in Engineering 2(4), 2014, 8 pages.

(Continued)

*Primary Examiner* — Jeffrey M Wollschlager
*Assistant Examiner* — Xue H Liu
(74) *Attorney, Agent, or Firm* — Slater Matsil, LLP

(57) ABSTRACT

A substrate processing system including a processing chamber, a substrate holder configured to hold and rotate a substrate about an axis perpendicular to a working surface of the substrate; an electron emitter adapted to emit a first electron beam directed at a first surface of a peripheral region of the substrate, the first electron beam having a first beam energy and a first beam current sufficient to vaporize material from the first surface of the peripheral region of the substrate; an airflow system configured to direct a flow of gas across the working surface of the substrate; and an exhaust system configured to collect the gas comprising the material vaporized from the peripheral region.

20 Claims, 5 Drawing Sheets

(56) References Cited

U.S. PATENT DOCUMENTS

| | | | |
|---|---|---|---|
| 2014/0308813 A1* | 10/2014 | Hsu | H01J 37/3053 438/692 |
| 2015/0306699 A1* | 10/2015 | Honda | H01J 37/243 219/76.12 |
| 2020/0033115 A1* | 1/2020 | Bezold | G01B 11/0625 |
| 2020/0048758 A1* | 2/2020 | Reinhold | C23C 14/543 |

OTHER PUBLICATIONS

Translation of Office Action from Japan Patent Office, Japanese Patent Application No. 2020-170275, Mailed: Jun. 18, 2024, 3 pages.

* cited by examiner

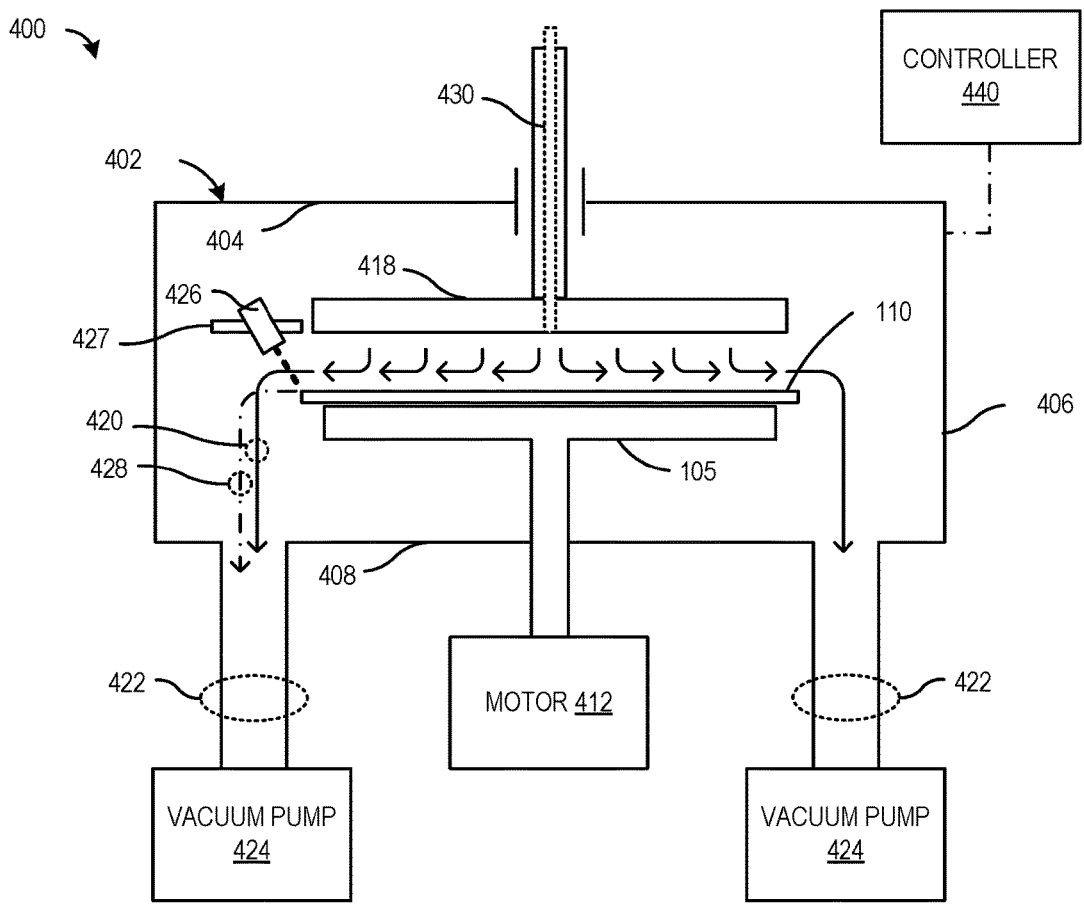
*Fig. 4*
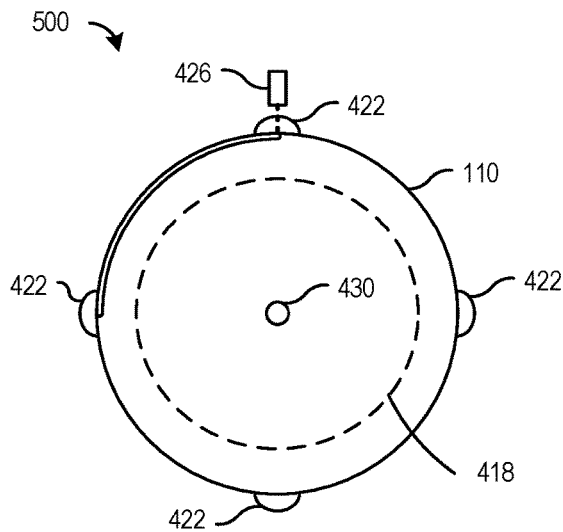 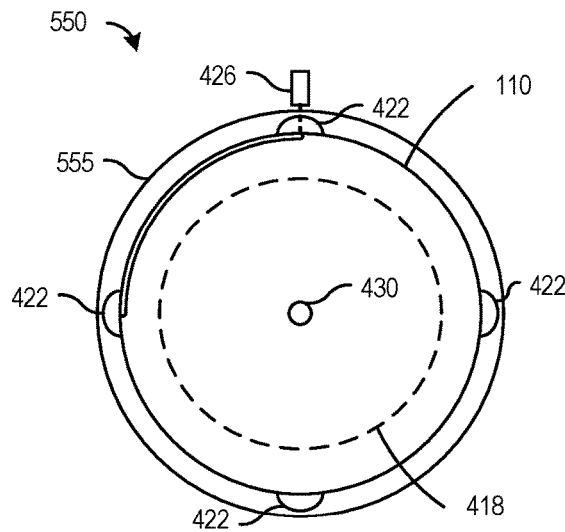
*Fig. 5A*  *Fig. 5B*

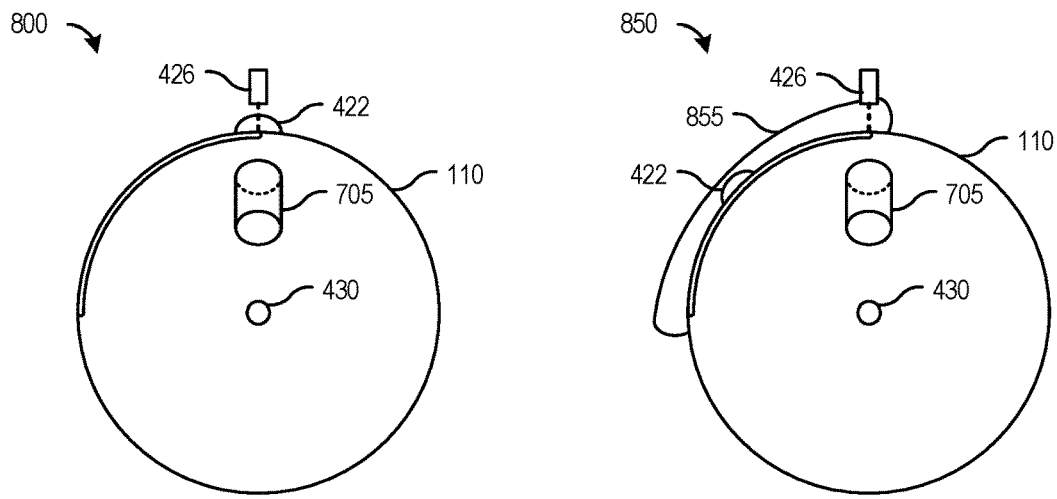
*Fig. 8A*                                    *Fig. 8B*
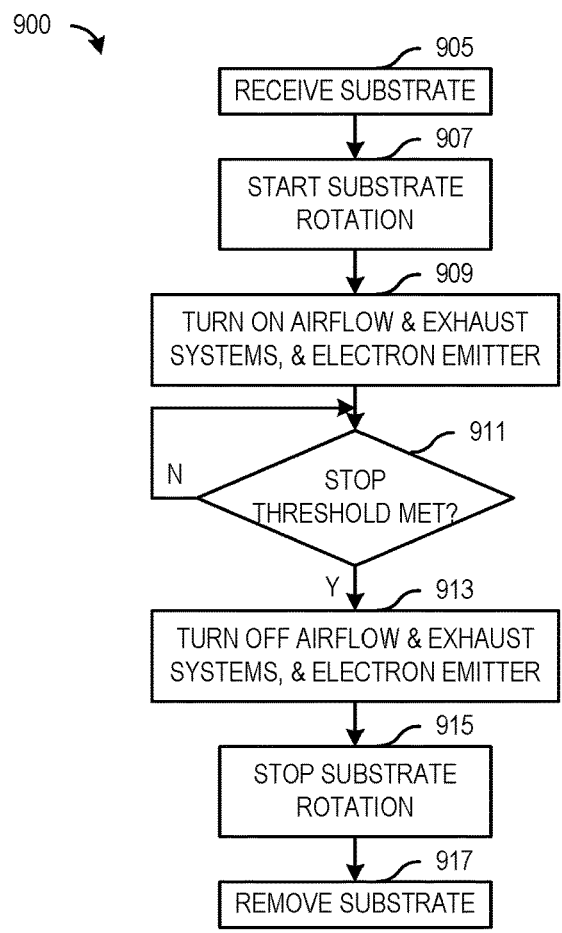
*Fig. 9*

APPARATUS AND METHODS FOR BEAM PROCESSING OF SUBSTRATES

This application claims the benefit of U.S. Provisional Application No. 62/914,160, filed on Oct. 11, 2019, entitled "Removal of Edge Bead Using an Electron Beam," which application is hereby incorporated herein by reference in its entirety.

TECHNICAL FIELD

The present invention relates generally to substrate processing, and, in particular embodiments, to apparatuses and methods for beam processing of substrates.

BACKGROUND

Semiconductor device fabrication generally involves a number of processes that may be used to form various features and multiple levels or layers of semiconductor devices on a top surface of a substrate, such as a semiconductor wafer. As an example, lithography is a process that typically involves transferring a prescribed circuit pattern to a photoresist layer formed on the top surface of the substrate. During the lithography process, a photoresist layer is formed on the top surface by dispensing an amount of liquid photoresist solution near the center of the substrate, distributing the resist solution across the top surface of the substrate using a spin-coating process, exposing the photoresist to radiation through a prescribed pattern, and subsequently developing the pattern, thereby producing a topographic pattern.

Photoresist spin-coating is conducted in an automated track system using substrate handling equipment that transports the substrates between the various lithography operating stations (such as photoresist spin-coating stations, developing stations, baking stations, chilling stations, and so forth). Automated substrate tracks enable various processing operations to be carried out simultaneously. One family of automated track systems widely used in the industry is the line of coater/developer tracks commercially available from vendors such as Tokyo Electron Limited.

During the spin-coating process, the substrate is held in a substrate holder (which may be a disk shaped rotating spin chuck, for example). The diameter of the substrate holder is less than the diameter of the substrate. The substrate holder is positioned so that the major surface of the substrate is oriented in a level horizontal plane. In operation, the substrate holder supports a backside of the substrate and applies suction to the backside of the substrate to hold the substrate in place as the substrate holder rotates. An amount of the liquid photoresist solution is applied at the center of the top surface of the substrate. The substrate holder rotates the substrate at a high rotational velocity to spread, by centrifugal force, the liquid photoresist solution radially outward from the center of the substrate towards the substrate's peripheral edge, coating the top surface of the substrate.

FIG. 1A illustrates a cross-sectional view of a portion of a conventional substrate holder 105 with substrate 110. As shown in FIG. 1A, a backside of substrate 110 is supported by substrate holder 105, which is also capable of rotating substrate 110. Highlighted is a peripheral region 115 of substrate 110, which is present around the entirety of substrate 110.

FIG. 1B illustrates a cross-sectional view of a portion of a convention substrate holder 105 with substrate 110, highlighting a photoresist layer 130 formed on the top surface of substrate 110. Photoresist layer 130, which is spin-coated on the top surface of substrate 110, includes an edge bead 135 formed as the excess liquid photoresist solution collects along peripheral region 115 of substrate 110.

Ideally, excess liquid photoresist solution is ejected from the peripheral edge of the wafer. In practice, however, some excess liquid photoresist solution accumulates along the peripheral edge of the substrate as an artifact of the spin-coating process, due to surface tension, for example. The liquid photoresist solution may accumulate on the top surface, the backside, on the edge, or a combination thereof, of the substrate. The accumulated liquid photoresist solution forms an edge bead as the photoresist solution solidifies. Portions of the edge bead may subsequently flake off and detach from the wafer and become a source of particulate contamination during subsequent process steps. Particulate contamination may unfortunately contribute to the yield loss of the integrated circuits being built on the wafer.

FIG. 2A illustrates a cross-sectional view of a portion of a prior art substrate processing system 200 highlighting a prior art chemical edge bead removal technique for removing an edge bead of a substrate.

As shown in FIG. 2A, substrate processing system 200 includes substrate holder 105 with substrate 110 supported by substrate holder 105. Substrate 110 has a photoresist layer 130 formed on its working surface. Edge bead 135 is present in peripheral region of substrate no. A solvent dispenser 205 dispenses a solvent 210 onto substrate 110, where solvent 210 softens and helps to remove edge bead 135. While solvent dispenser 205 is dispensing solvent 210, substrate holder 105 is rotating substrate 110. A disadvantage of chemical edge bead removal is that the chemical edge bead removal typically has to be performed within a short amount of time after photoresist layer 130 is formed, before the liquid photoresist material fully cures.

FIG. 2B illustrates a cross-sectional view of a portion of a prior art substrate processing system 250 highlighting a prior art wafer edge exposure (WEE) technique for removing an edge bead of a substrate.

As shown in FIG. 2B, substrate processing system 250 includes substrate holder 105 with substrate 110 supported by substrate holder 105. Substrate 110 has a photoresist layer 130 formed on its working surface. Edge bead 135 is present in peripheral region of substrate no. A light source 255 emits light (such as ultra-violet light, wideband light, and so on) 260 through a mask 265 to expose edge bead 135 without exposing the remainder of photoresist layer 130. While light source 255 is emitting light 260, substrate holder 105 is rotating substrate no. A disadvantage of WEE is that WEE is effective only with photoresist materials and is generally ineffective on other materials such as ARCs, polyimides, and so forth, which are substantially non-reactive to the light used in WEE. Hence, WEE cannot be used to remove these materials from the edge bead.

SUMMARY

In accordance with an embodiment of the invention, a substrate processing system is provided. The substrate processing system comprising: a processing chamber; a substrate holder disposed in the processing chamber, the substrate holder configured to hold and rotate a substrate about an axis perpendicular to a working surface of the substrate; an electron emitter adapted to emit a first electron beam directed at a first surface of a peripheral region of the substrate, the first electron beam having a first beam energy and a first beam current sufficient to vaporize material from the first surface of the peripheral region of the substrate; an airflow system configured to direct a flow of gas across the working surface of the substrate; and an exhaust system configured to collect the gas comprising the material vaporized from the peripheral region.

In accordance with another embodiment, a method is provided for processing a substrate. The method comprising: receiving the substrate in a substrate holder of a processing chamber; rotating the substrate about an axis perpendicular to a working surface of the substrate; turning on an airflow system to direct a flow of gas across the working surface of the substrate; and exposing a peripheral region of the substrate to a first electron beam to vaporize material from the peripheral region of the substrate.

In accordance with still another embodiment of the invention, a method is provided for processing a substrate. The method comprising: receiving the substrate; flowing gas across a working surface of the substrate, the gas flowing at a specified flow rate; while rotating the substrate about an axis perpendicular to the working surface of the substrate, vaporizing a portion of a material in a peripheral region of the substrate by exposing the peripheral region to an electron beam from an electron emitter; and determining that a stop threshold is met, and based thereon, turning off the electron emitter.

BRIEF DESCRIPTION OF THE DRAWINGS

For a more complete understanding of the present invention, and the advantages thereof, reference is now made to the following descriptions taken in conjunction with the accompanying drawings, in which:

FIG. 4 illustrates a view of a first example material removal system according to example embodiments presented herein;

FIG. 5A illustrates a top view of a first example chamber of material removal system of FIG. 4 according to example embodiments presented herein;

FIG. 5B illustrates a top view of a second example chamber of material removal system of FIG. 4 according to example embodiments presented herein;

FIG. 8A illustrates a top view of a first example chamber of material removal system of FIG. 7 according to example embodiments presented herein;

FIG. 8B illustrates a top view of a second example chamber of material removal system of FIG. 7 according to example embodiments presented herein; and FIG. 9 illustrates a flow diagram of example process occurring in removing material from a peripheral edge of a substrate using an electron beam in accordance with example embodiments presented herein.

Figure 1A:
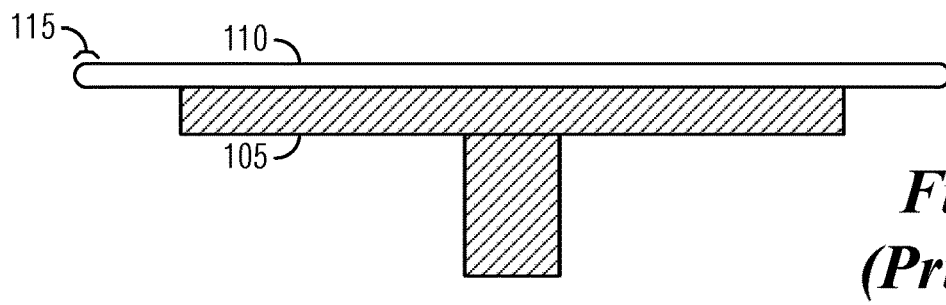
FIG. 1A illustrates a cross-sectional view of a portion of a prior art substrate holder with substrate.
Figure 1B:
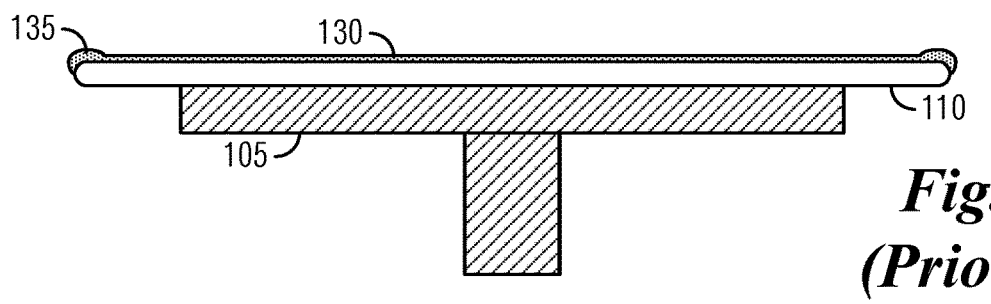
FIG. 1B illustrates a cross-sectional view of a portion of a prior art substrate holder with substrate, highlighting a photoresist layer formed on the substrate.
Figure 2A:
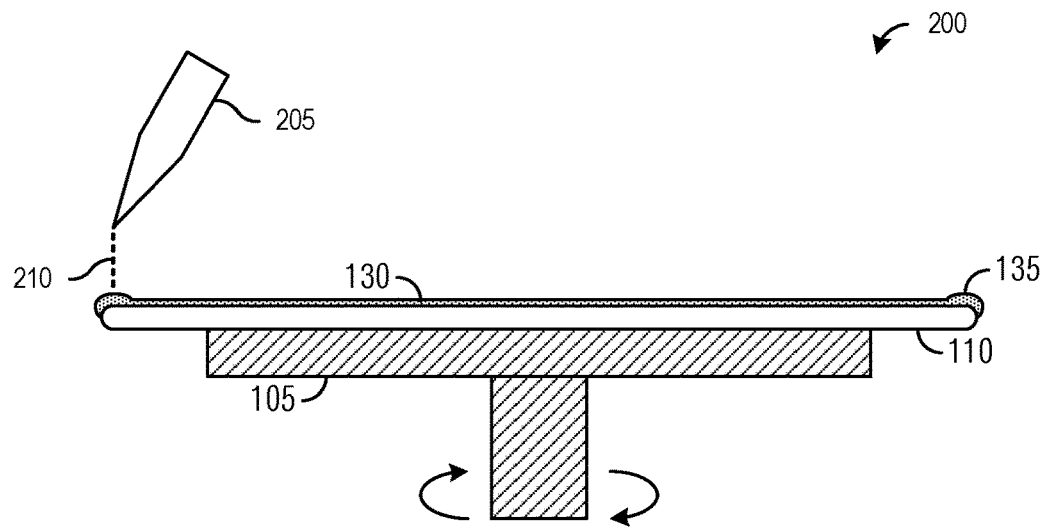
FIG. 2A illustrates a cross-sectional view of a portion of a prior art substrate processing system highlighting a prior art chemical edge bead removal technique for removing an edge bead of a substrate.
Figure 2B:
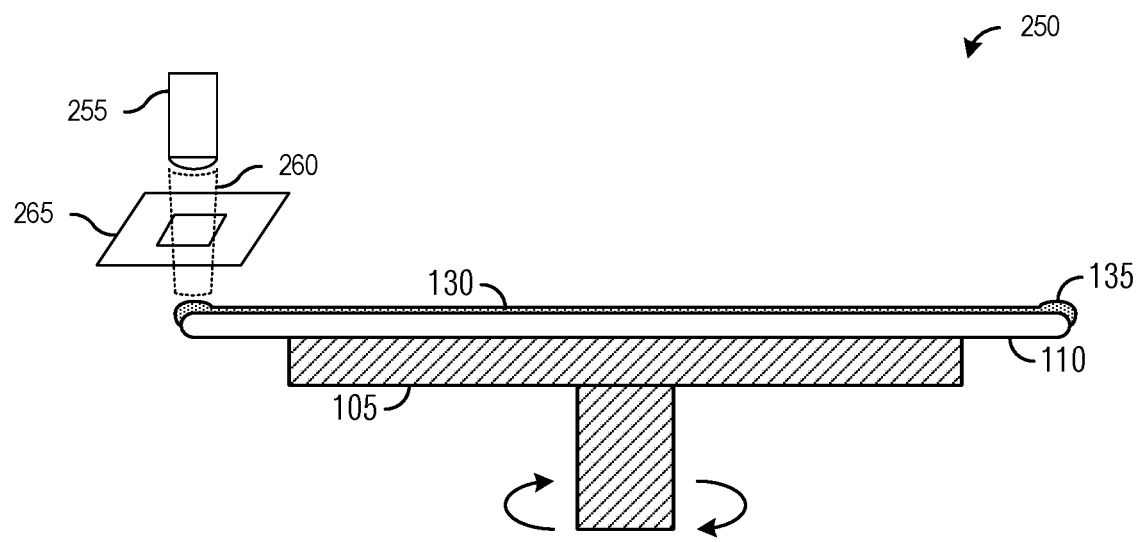
FIG. 2B illustrates a cross-sectional view of a portion of a prior art substrate processing system highlighting a prior art wafer edge exposure (WEE) technique for removing an edge bead of a substrate.

Corresponding numerals and symbols in the different figures generally refer to corresponding parts unless otherwise indicated. The figures are drawn to clearly illustrate the relevant aspects of the embodiments and are not necessarily drawn to scale. The edges of features drawn in the figures do not necessarily indicate the termination of the extent of the feature.

DETAILED DESCRIPTION OF ILLUSTRATIVE EMBODIMENTS

The making and using of various embodiments are discussed in detail below. It should be appreciated, however, that the various embodiments described herein are applicable in a wide variety of specific contexts. The specific embodiments discussed are merely illustrative of specific ways to make and use various embodiments, and should not be construed in a limited scope.

Various techniques, as described herein, pertain to the removal of material along a peripheral region of a substrate using an electron beam. As an example, an edge bead comprising material, such as metal-containing photoresist material, is removed along the peripheral region of the substrate by exposing the peripheral region of the substrate to an electron beam as the substrate is rotated by a substrate holder. The electron beam, having an electron beam exposure that is based on the material being removed or by metrology data, vaporizes the metal-containing photoresist material. The electron beam exposure may be characterized by the beam energy, beam current, beam size, and on time duration, for example. The rotating substrate prevents any particular portion of the substrate being overheated by the electron beam and becoming damaged, as well as provides a degree of precision that is typically not achievable when moving the electron beam along the peripheral region of a fixed substrate.

Some material, such as photoresists, anti-reflective coatings (ARC), polyimide coatings, and so forth, are deposited on a working surface of a substrate by spin-coating. Spin-coating is a process where the material, in fluid form, is deposited in the middle of the working surface of the substrate and the substrate is rapidly rotated to distribute the material in a thin-film over the working surface of the substrate. Spin-coating may be followed with baking to cure or set the material. In addition to forming the thin-film over the working surface of the substrate, the spin-coating process may also form an edge bead at the peripheral region of a substrate that can lead to significant issues in the processing of the substrate. The edge bead may form due to the surface tension of the material while in the fluid form.

The edge bead may form on the top surface of the substrate (commonly referred to as the working surface of the substrate), on the bottom surface of the substrate (commonly referred to as the backside of the substrate), on the edge of the substrate, or a combination thereof, for example. A common problem with the edge bead is that the edge bead material may flake off as the substrate is being handled (such as when the substrate is grasped by transfer robots and moved between substrate processing stations) and deposit on the working surface of the substrate (where they are contaminants and can lead to decreased in yield) or on the surface of processing equipment (such as the surface of the substrate holder, which can lead to poor contact between the substrate and the substrate holder and a potentially significant decrease in yield due to misalignment of the substrate during subsequent process steps). Hence, there is a need for removing the edge bead.

According to an example embodiment, a material removal system uses an electron beam to remove material from a peripheral region of a substrate. The material removal system includes an electron emitter that produces an electron beam oriented at the peripheral region of the substrate. The electron beam may be used to remove material from the peripheral region of the working surface of the substrate, the backside of the substrate, the edge of the substrate, or a combination of the working surface, the backside, and the edge of the substrate. The material being removed may include edge bead formed in the peripheral region as well as some portion of the spin-coated film. The material, which may include spin-coated photoresist (including but not limited to metal-containing photoresist, long chain polymer photoresist, and so on), ARC, polyimide, etc., is heated and subsequently vaporized by the exposure of the electron beam.

An advantage of the electron beam is that the electron beam is unaffected by surface reflectivity, which is a problem with laser beams and highly reflective materials. As an example, metal-containing photoresists which are reflective to laser beams and light beams, but are typically non-reflective to electron beams.

The remainder of the discussion focuses on electron beams, electron sources, and using electron beams to remove material on a substrate. However, other types of beams, such as ion beams that involve volatile or inert atoms (such as argon, hydrogen, etc.), and so forth, may be used to remove material on a substrate. Therefore, the focus on electron beams should not be construed as being limiting to the scope of the example embodiments.

In an embodiment, the material removal system includes an exhaust system or a vacuum system that remove the vaporized material, preventing the vaporized material from depositing on the substrate or the substrate processing tools. If the vaporized material is allowed to settle back onto the substrate, the vaporized material contaminates the substrate and lead to reduced yield. If the vaporized material is allowed to settle onto the substrate processing tools, the vaporized material may prevent the substrate from being properly located in the substrate processing tools, leading to warped or misaligned substrates.

In an embodiment, the substrate is rotated at a particular rate (e.g., RPM or angular velocity). Rotating the substrate, while the electron beam remains fixed, may be more precise than moving the electron beam around the peripheral region of the fixed substrate (by physically moving the electron emitter or deflecting the electron beam using magnetic fields or electric fields, for example). The substrate may be rotated by the substrate holder, for example. As an example, the substrate holder used to spin-coat the substrate may also be used to rotate the substrate for material removal purposes. As another example, a substrate holder of a substrate processing tool specifically designed for material removal is used to rotate the substrate for material removal purposes. The rotation of the substrate may help to ensure that the exposure of the electron beam incident on the substrate by the electron beam is relatively constant. Furthermore, the rotation of the substrate may help to ensure that the electron beam is not incident on any particular portion of the substrate for an extended amount of time, which may potentially overheat the portion of the substrate, and damaging the substrate.

In an embodiment, the removal of the material in the peripheral region of the substrate occurs immediately after the spin-coating of the material onto the substrate. Removing the material immediately after the spin-coating step may help to enable more rapid removal of the spin-coated material because the spin-coated material has not been allowed to set, nor has the spin-coated material been baked. Additionally, removing the material immediately after the spin-coating step may utilize the same processing tools used in the spin-coating step (with the addition of the electron emitter and potentially the exhaust system), thereby eliminating the need to move the substrate to a separate material removing station.

In an embodiment, the removal of the material in the peripheral region of the substrate occurs after the spin-coating of the material onto the substrate, where the removal of the material occurs in a processing tool different from the processing tool used to spin coat the material onto the substrate. The removal of the material in a separate processing tool allows for the optimization of the processing tool for the material removal, which can improve overall efficiency.

In an embodiment, the removal of the material in the peripheral region of the substrate occurs after baking the substrate to set or cure the spin-coated material. Removing the material after baking the spin-coated material may be performed in a station dedicated to material removal, negating a need to alter existing baking stations. Alternatively, removing the material after baking the spin-coated material may be performed in the station used to bake the substrate (with the addition of the electron emitter, exhaust system, and a rotating substrate holder), which would eliminate the need to move the substrate to a separate material removing station.

In an embodiment, the removal of the material in the peripheral region of the substrate occurs before baking the substrate to set or cure the spin-coated material. Removing the material prior to baking the spin-coated material may simplify the material removal process because the material has not set or cured, which may make removing the material more difficult.

Figure 3:
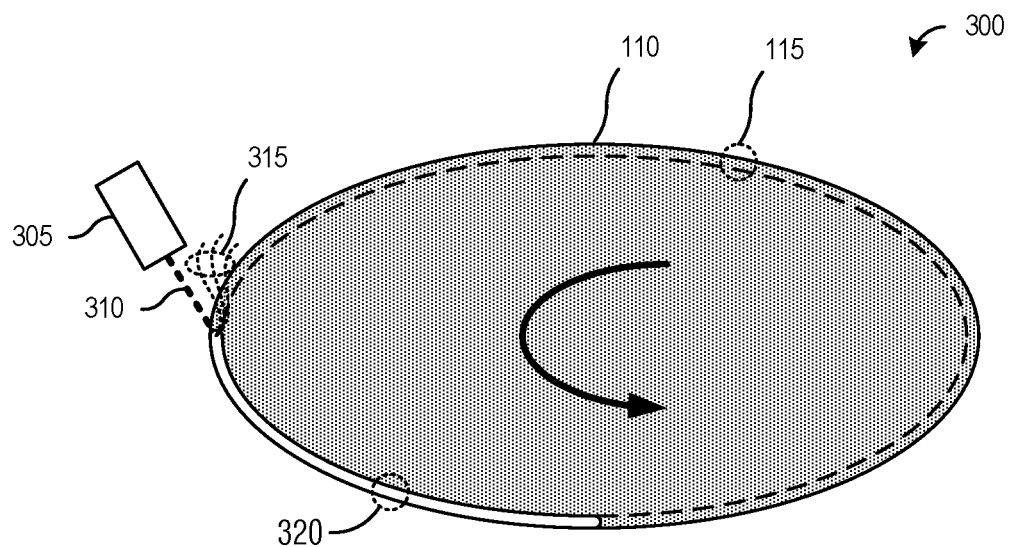
FIG. 3 illustrates an isometric view of a portion of a material removal system according to example embodiments presented herein.

FIG. 3 illustrates an isometric view of a portion of a material removal system 300 according to example embodiments presented herein. Material removal system 300 includes a substrate 110 on a substrate holder (not shown in FIG. 3) that is configured to rotate substrate 110 at a specified rate. Substrate 110 has a peripheral region 115 that includes an edge bead of spin-coated material to be removed by material removal system 300. Material removal system 300 also includes an electron emitter 305 configured to emit an electron beam 310 at a specified electron energy and a specified electron current. Electron beam 310 is incident on the spin-coated material in peripheral region 115 of substrate 110, heating up the spin-coated material and vaporizing the spin-coated material. Vaporized material is shown in FIG. 3 as dotted lines 315. A portion of peripheral region 115, shown as cleared region 320, represents a portion of substrate 110 where the spin-coated material has been removed.

Although electron emitter 305 is shown in FIG. 3 as being oriented towards the working surface of substrate 110, electron emitter 305 may be moved to a new position so that electron beam 310 is oriented towards the backside of substrate 110 or the edge of substrate 110. Alternatively, material removal system 300 may include a two or more electron emitters. As an example, a first electron emitter may be oriented as electron emitter 305 as shown in FIG. 3 and a second electron emitter may be oriented so that an electron beam produced by the second electron emitter is oriented towards the backside of substrate 110. In such an example, a third electron emitter may be oriented so that an electron beam produced by the third electron beam is oriented towards the edge of substrate 110.

In another alternative example, a single electron emitter emits a first electron beam with sufficient electron beam energy and current is used to vaporize the edge bead on the working surface of substrate 110, and a second electron beam with sufficient electron beam energy and current to vaporize the edge bead on the backside of substrate 110. The second electron beam has sufficient electron beam energy so that the electrons pass through substrate 110 without substantially heating substrate 110, therefore preventing damage to substrate 110. The electrons of the second electron beam have such high beam energy that they pass through the electron cloud of the atoms of substrate 110 with no interaction (or little interaction) so substrate 110 is not heated to the point of damaging substrate 110. However, as the second electron beam passes through substrate 110, the second electron beam's energy is attenuated down to a level that is sufficient to vaporize the edge bead present on the backside of substrate 110. In other words, when the beam energy of the second electron beam drops down (to about equal to the beam energy of the first electron beam, for example), the electrons of the second electron beam interact more with the electron clouds of the atoms of the material of the edge beam and vaporizing the material. Therefore, the illustration and discussion of a single electron emitter producing an electron beam oriented towards the working surface of the substrate should not be construed as being limiting to the scope of the example embodiments.

In an embodiment, the electron beam has a beamwidth sufficiently wide to remove material from the working surface of the peripheral region as well as from at least a portion of the edge of the substrate.

In an embodiment, the electron emitter is oriented so that the electron beam is orthogonal to the working surface of substrate. The electron beam being orthogonal to the working surface of the substrate may maximize the effectiveness of the electron beam.

In an embodiment, the electron beam used to vaporize the material is characterized by physical measures of the electron beam. Physical measures of the electron beam include the energy of the electrons in electron beam, as well as the number of electrons in the electron beam.

As an example, the electron beam is characterized by the electron beam's beam energy and beam flux or beam current. The beam energy is a measure of the amount of energy of the electrons in the electron beam and determines the ability of the electrons to penetrate the material. The penetration increases with increased beam energy. A relatively low beam energy, sufficient to penetrate the material to be removed but not deep into the substrate, should be selected. A beam with high beam energy may be able to penetrate the material without substantially heating the material because the electrons pass through the electron cloud of the individual atoms without interaction. Once the beam energy of the beam decreases to a point where the electrons begin to interact with the electron cloud of the individual atoms of the material and heat up the material to the vaporization point.

In a situation where a low beam energy cannot be produced, a physical technique may be used to reduce the beam energy. As an example, the beam energy may be reduced by passing the electron beam through a metallic foil.

The beam current (or the beam flux) determines the temperature rise in the material. A relatively low beam current results in a localized temperature rise, which may be beneficial. For example, with a localized temperature rise, only the surface of the substrate's peripheral region is heated, while the bulk of the remainder of the substrate is unaffected. The heating of the substrate may be configured so that sufficient heat is provided to the surface of the substrate to vaporize the material. As another example, the electron beam is characterized by a beam size. A narrow beam size may be able to more rapidly vaporize the material being removed than a wide beam size due to smaller amount of material being exposed to the electron beam, for example.

In an embodiment, the characterization of the electron beam also includes a beam type of the electron beam. As an example, the beam type may be continuous or pulsed. As an example, the electron beam is a continuous beam of electrons. The continuous beam of electrons provides consistent heating of the material being removed. As another example, the electron beam is a pulsed beam of electrons. The electron beam is a pulsed beam with a specified pulse width and duty cycle. The pulsed electron beam may reduce ionization of the gas flowing over the substrate, which may enhance the ability of the electrons to vaporize the material being removed. Additionally, pulsed operation may help to reduce heat build-up in the substrate (due to thermal conduction) because the heated material is allowed to cool in between pulses.

In an embodiment, the electron beam is also characterized by an electron beam exposure (or equivalently, electron beam dose), where an electron beam exposure is a measure of an amount of time that a particular portion of the material is exposed to the electron beam. The electron beam exposure may be used to determine a stop threshold that is used to determine when to stop the material removal process. An electron beam exposure may be a function of the amount of time that the electron emitter is emitting electrons. In other words, the electron beam exposure is a function of how long the electron beam is on. The electron beam exposure may also be a function of the rotation rate of the substrate. As an example, if the rotation rate of the substrate is low (low RPM or low angular velocity), then each portion of the substrate is exposed to the electron beam for a longer time interval than if the rotation rate of the substrate is high. Hence the electron beam exposure is high. Conversely, if the substrate is rotated at a high rate (high RPM or high angular velocity), then each portion of the substrate is exposed to the electron beam for a shorter duration. However, if the substrate is rotated at a high rate and if the time that the electron beam is on is also long, then an effective electron beam exposure is high because each portion of the substrate is exposed to the electron beam for a greater number of times due to the longer on time of the electron beam, although each exposure may be shorter due to the higher rotation rate.

In an embodiment, the electron beam exposure used to remove a material is dependent upon the material being removed, as well as the amount of the material present. As an example, if the material being removed has a high nuclear density, the electron beam is expected to more rapidly heat up the material. Therefore, the electron beam exposure may be lower when the material being removed has a higher nuclear density. Alternatively, the beam energy and beam current may be lower. Similarly, if the material being removed has a low nuclear density, the electron beam does not heat up the material as rapidly, hence the electron beam exposure may need to be higher when the material has a lower nuclear density. Furthermore, if there is a large amount of material to be removed, the electron beam exposure may need to be correspondingly greater.

Once the electron beam exposure is determined in accordance with the material being removed and material amount being removed, the characteristics of the electron beam may be determined. As an example, for a particular material, the electron energy and electron current (which may be electron emitter dependent), as well as the rotation rate and the electron beam size and duration, can be determined.

As an example, in a situation where the material being removed is a metal-containing photoresist material, the electron beam may have a beam energy in the range of 2 KeV and 20 KeV, a beam current in the range of 1 mA and 30 mA, a rotation rate of 500 RPM and 3000 RPM, a beamwidth in the range of 0.5 mm to 2 mm, and an electron emitter emission duration sufficient to have the electron beam incident upon every part of the peripheral region of the substrate a range of 2 times and 50 times. In an example, the beam type of the electron beam is continuous. In another example, the beam type of the electron beam is pulsed, where the electron beam has pulse durations in the range of 10 ns and 100 ns with a duty cycle in the range of 30% and 70%. The electron beam, with beam energy in the range of 2 KeV and 20 KeV and a beam current in the range of 1 mA and 30 mA, has sufficient energy and current to raise the temperature of the material to a range of 1000 degrees K and 2000 degrees K, which will vaporize the metal-containing photoresist. Other materials may require the electron beam with different characteristics, e.g., beam energy, beam current, beam size, duration, and so on. As another example, a material with greater nuclear density may be more susceptible to the electron beam and the beam energy or beam current of the electron beam may be less (when compared to a material with lesser nuclear density) and still be capable of increasing the temperature of the material to the point of vaporizing the material.

As another example, in a situation where the electron beam is emitted by a single electron emitter but the material is to be removed from both the working surface and the backside of the peripheral region of the substrate, the electron emitter is configured to emit two electron beams: a first electron beam with a first set of characteristics to vaporize material on a first surface of the peripheral region (where the first surface is closest to the electron emitter, for example) and a second electron beam with a second set of characteristics to vaporize material on a second surface of the peripheral region (where the second surface is opposite to the first surface). As an example, the first surface is the working surface of the substrate and the second surface is the backside of the substrate. The first electron beam has a beam energy in the range of 2 KeV and 20 KeV and a beam current in the range of 1 mA and 30 mA and the second electron beam has a beam energy in the range of 50 KeV and 100 KeV and a beam current in the range of 1 mA and 30 mA. In an example, the beam types of the first electron beam and the second electron beams are both continuous. In another example, the beam types of the first electron beam and the second electron beams are both pulsed with pulse durations in the range of 10 ns and 100 ns and a duty cycle in the range of 30% and 70%. In another example, the beam types of the first electron beam and the second electron beams are both pulsed with different pulse durations or duty cycles. In another example, one beam type of the first or second electron beams is continuous while the other beam type is pulsed. Both the first electron beam and the second electron beam may be on for a duration sufficient to have the first and second electron beams incident upon every portion of the corresponding surface of the peripheral region of the substrate a range of 2 times and 50 times. Both the first and second electron beam may have the same beamwidth. In such an example, the electron emitter may be configured to emit the first electron beam to remove the material from the first surface of the substrate and then the electron emitter emits the second electron beam to remove the material from the second surface of the substrate, for example.

In an embodiment, an airflow system that supplies a gas over the entirety of the substrate is provided. An airflow system that supplies the gas over the entirety of the substrate helps to prevent vaporized material from depositing on the substrate or the material removal system and contaminating them. The gas is supplied at a flow rate sufficient to entrain the vaporized material. Examples of the gas supplied by the airflow system include air, N2, inert gases (such as argon), or a combination thereof.

In an embodiment, metrology data is also used to determine the stop threshold that is used to determine when to stop the material removal process. Metrology data, including metrology image data, sensor data (including but not limited to temperature data, and detected vaporized material data), and so on, is provided to a controller controlling the material removal system and the controller determines adjustments to the electron beam characteristics based on the metrology data. As an example, if metrology image data indicates that the material has been removed from the peripheral region of the substrate, the controller may turn off the electron emitter. As another example, if metrology image data indicates that the material remains on the substrate after a specified electron beam exposure, the controller may adjust the electron emitter to continue generating the electron beam to continue the material removal process. As another example, if the temperature data indicates that the substrate is becoming too hot, the controller may adjust the electron emitter so that the electron beam generated by the electron emitter heats the substrate to a lesser extent. As yet another example, if the metrology data indicates that vaporized material is no longer detectable in the gas flow flowing over the surface of the substrate, the controller may determine that the material has been removed from the peripheral region of the substrate and turn off the electron emitter.

FIG. 4 illustrates a view of a first example material removal system 400 according to example embodiments presented herein. Material removal system 400 may be used for operations such as removal of material at the peripheral edge of a substrate. The material being removed may be on the working surface of the substrate, the backside of the substrate, edge of the substrate, or a combination thereof. Material removal system 400 includes a chamber 402 with top 404, walls 406, and bottom 408. Chamber 402 may be sealed or open.

Material removal system 400 includes a substrate holder 105 that is coupled to a motor 412 that is capable of rotating substrate holder 105. Substrate holder 105 enables the mounting of substrate 110 to be processed. Substrate holder 105 may hold substrate 110 by vacuum suction. Substrate 110 may be moved into chamber 402 through a loading or unloading port.

A showerhead 418 located above substrate holder 105 is configured to direct gas 420 across the working surface of substrate 110. Showerhead 418 is part of an airflow system, which is configured to provide a flow of gas over substrate 110. Showerhead 418 may direct gas 420 over the entire surface of substrate 110 or any particular portion of the surface of substrate 110. Gas 420 is supplied at a flow rate sufficient to entrain the vaporized material. Examples of gas 420 include air, N2, inert gases (such as argon), or a combination thereof. Gas 420 is collected through an exhaust system (e.g., outlets 422 and vacuum pumps 424). Poor airflow may produce undesirable eddies and potentially result in vaporized material depositing in chamber 402 or on substrate 110. Placing showerhead 418 directly over substrate 110 and configuring showerhead 418 to direct gas 420 over the entire surface of substrate 110 may be beneficial to reducing or eliminating eddies. A showerhead 418 over the whole substrate 110 may provide airflow that is smooth in radial and azimuthal directions. Then, outlets 422 can capture the airflow along with vaporized material 428 that may contaminate subsequent substrate processing.

Material removal system 400 includes an electron emitter 426 configured to emit an electron beam having a beam energy, a beam current, beam type, and duration (e.g., a beamwidth and duration) at a peripheral region of substrate 110. The electron beam heats up and vaporizes materials on substrate 110. As shown in FIG. 4, electron emitter 426 is oriented at the working surface of substrate 110. Material removal system 400 may also include additional electron emitters oriented at other portions of substrate 110.

Electron emitter 426 may be coupled to an alignment system 427 that allows electron emitter 426 to be moved along an axis parallel to the working surface of substrate 110 or pivoted (or both moved and pivoted) so that the electron beam emitted by electron emitter 426 is directed at the peripheral region of substrate 110. As an example, electron emitter 426 is aligned with the peripheral region of substrate 110 using alignment system 427. The alignment of electron emitter 426 may occur for each substrate loaded into material removal system 400. Alternatively, electron emitter 426 may be aligned for each substrate type loaded into material removal system 400. In other words, if multiple substrates of the same type (e.g., same process lot) are processed by material removal system 400, electron emitter 426 may be aligned only for the first substrate and not for each remaining substrate of the same process lot.

Vaporized material 428 is entrained in gas 420 provided by showerhead 418 and is collected through outlets 422 by vacuum pumps 424. Alternatively, electron emitter 426 emits multiple electron beams (with different beam energy, beam current, and duration) to vaporize material on different surfaces of substrate 110, as discussed previously.

In a situation where material removal system 400 is also used for spin-coat deposition, nozzle 430 is configured to dispense the spin-coat material in liquid form onto substrate 110, which is rotated at a high rate by substrate holder 105. As shown in FIG. 4, nozzle 430 is part of showerhead 418. However, alternative embodiments are possible. As an example, nozzle 430 may enter chamber 402 through wall 406 and routed over the center of substrate 110.

A controller 440 coupled (shown as a dot-dashed line) to various components of material removal system 400 (such as substrate holder 105, motor 412, vacuum pump 424, electron emitter 426, and so on) or sensors or metrology tools (e.g., sensors or metrology tools located in chamber 402, substrate holder 105, motor 412, vacuum pump 424, electron emitter 426, and so on) is capable of measuring an operating variable, such as temperature, amount of vaporized material, amount of unvaporized material remaining on substrate 110, etc., to adjust the electron beam parameters (e.g., beam energy, beam current, beamwidth, beam type, exposure, etc.), substrate rotation rate, and so forth, to help control the material removal process.

As an example, controller 440 detects that the temperature of substrate 110 is high and turns off or reduces the beam energy and beam current of the electron beam, increases the rotation rate, and so on, to help protect substrate 110 from overheating. As another example, controller 440 utilizes metrology data (e.g., metrology images (from a camera, for example) of the amount of material in the peripheral region of substrate 110) and adjusts the beam parameters to control the removal of the material from the peripheral region. In this example, controller 440 may use the metrology images to determine the amount of material remaining in the peripheral region of substrate 110 and when the material has been removed, controller 440 halts the emissions from electron emitter 426. In this example, if controller 440 determines that a period of time has elapsed and material remains in the peripheral region of substrate 110, controller 440 may adjust the beam parameters to accelerate the rate at which the material is being vaporized. In addition to temperature and image metrology data, controller 440 may be able to detect the presence or absence of vaporized material 428 entrained in gas 420 to make adjustments to the beam parameters.

In an embodiment, to provide electrostatic protection, chamber 402 may be electrically grounded. Similarly, electron emitter 426 may be electrically grounded. Furthermore, X-ray shielding may be installed in chamber 402, around substrate 110, around material removal system 400, or a combination thereof, to provide protection from X-rays produced by electron emitter 426.

FIG. 5A illustrates a top view of a first example chamber 500 of material removal system 400 according to example embodiments presented herein. Chamber 500 includes outlets 422 located around substrate 110 to collect gas 420 and vaporized material 428 to prevent vaporized material 428 from depositing on the working surface of substrate 110. As shown in FIG. 5A, at least one outlet 422 is located near electron emitter 426 to enhance collection of vaporized material 428 where it is formed. Although four outlets 422 are shown in FIG. 5A, fewer or greater numbers of outlets 422 are possible.

FIG. 5B illustrates a top view of a second example chamber 550 of material removal system 400 according to example embodiments presented herein. Chamber 550 includes outlets 422 located around substrate 110 to collect gas 420 and vaporized material 428 to prevent vaporized material 428 from depositing on the working surface of substrate 110. The collection of gas 420 and vaporized material 428 is enhanced by shield 555 that forms a barrier around substrate 110 to help direct gas 420 and vaporized material 428 into outlets 422. Although four outlets 422 are shown in FIG. 5B, fewer or greater numbers of outlets 422 are possible. Furthermore, shield 555 is shown as fully enclosing substrate 110, embodiments where shield 555 only enclosing portions of substrate 110 are possible.

Figure 6:
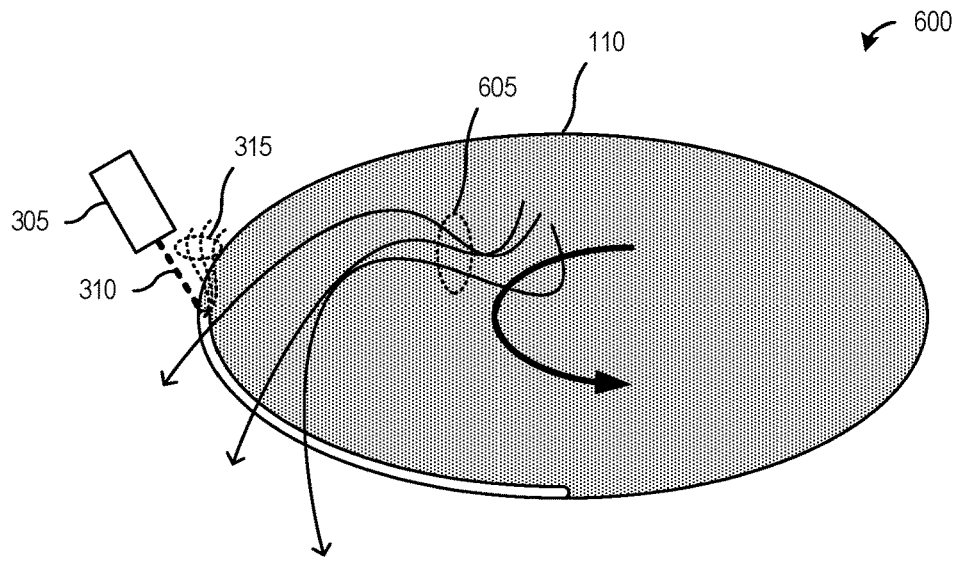
FIG. 6 illustrates an isometric view of a portion of a material removal system highlighting an airstream being entrained by a rapidly rotating substrate according to example embodiments presented herein.

FIG. 6 illustrates an isometric view of a portion of a material removal system 600 highlighting an airstream being entrained by a rapidly rotating substrate according to example embodiments presented herein. Material removal system 600 includes a substrate 110 on a substrate holder (not shown in FIG. 6) that is configured to rotate substrate 110 at a specified rate. Material removal system 600 also includes an electron emitter 305 configured to emit an electron beam 310 at a specified electron energy and a specified electron current. Electron beam 310 is incident on the spin-coated material of substrate 110, heating up the spin-coated material and vaporizing the spin-coated material. Vaporized material is shown in FIG. 6 as dotted lines 315.

Gas 605, introduced by a showerhead, for example, is entrained by the rapidly rotating substrate 110. The entrained gas 605 also evacuates vaporized material produced by electron emitter 305 and electron beam.

In an embodiment, an airflow system that supplies gas over a localized portion of the substrate is provided. The gas is supplied at a flow rate sufficient to entrain the vaporized material. An airflow system that supplies gas over a localized portion of the substrate in close proximity to where the vaporized material is formed helps to prevent vaporized material from depositing on the substrate or the material removal system and contaminating them, while keeping the airflow system complexity low.

Figure 7:
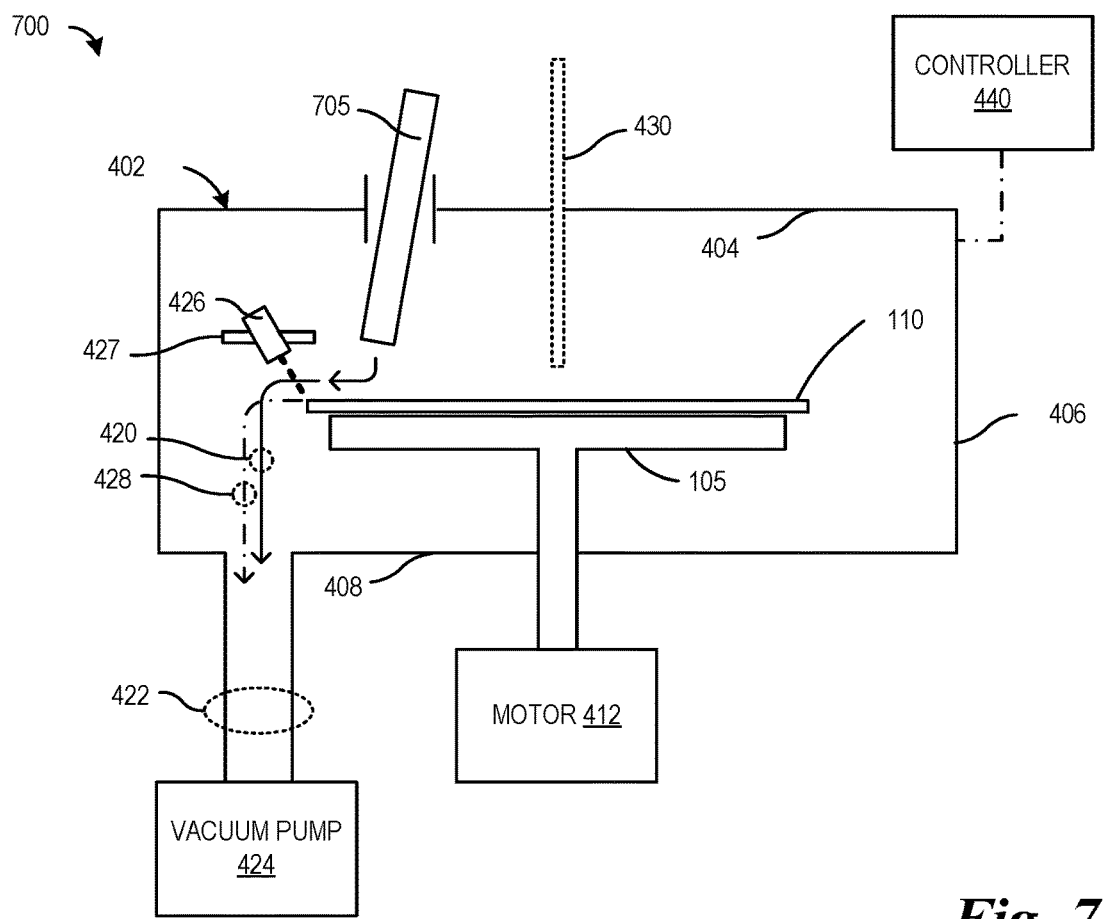
FIG. 7 illustrates a view of a second example material removal system according to example embodiments presented herein.

FIG. 7 illustrates a view of a second example material removal system 700 according to example embodiments presented herein. Material removal system 700 may be used for operations such as removal of material at the peripheral edge of a substrate. The material being removed may be on the working surface of the substrate, the backside of the substrate, edge of the substrate, or a combination thereof. Material removal system 700 includes a chamber 402 with top 404, walls 406, and bottom 408. Chamber 402 may be sealed or open.

Material removal system 700 includes a substrate holder 105 that is coupled to a motor 412 that is capable of rotating substrate holder 105. Substrate holder 105 enables the mounting of substrate 110 to be processed. Substrate holder 105 may hold substrate 110 by vacuum suction. Substrate 110 may be moved into chamber 402 through a loading or unloading port.

A gas nozzle 705 located above substrate holder 105 is part of the airflow system that is configured to direct gas 420 at a portion of the surface of substrate 110 near where the electron beam produced by electron emitter 426 vaporizes material in the peripheral region of substrate 110. Gas nozzle 705 is oriented towards electron emitter 426 so that gas 420 is flowing towards electron emitter 426. Gas 420 is supplied at a flow rate sufficient to entrain vaporized material 428. Gas 420 entrains vaporized material 428 and both are evacuated through outlets 422 by vacuum pump 424. Electron emitter 426 may be coupled to an alignment system 427 that allows electron emitter 426 to be moved along an axis parallel to the working surface of substrate 110 or pivoted (or both moved and pivoted) so that the electron beam emitted by electron emitter 426 is directed at the peripheral region of substrate 110.

In a situation where material removal system 400 is also used for spin-coat deposition, nozzle 430 is configured to dispense the spin-coat material in liquid form onto substrate 110, which is rotated at a high rate by substrate holder 105. As shown in FIG. 7, nozzle 430 enters chamber 402 through top 404 at or near the center of substrate 110. However, alternative embodiments are possible. As an example, nozzle 430 may enter chamber 402 through wall 406 and routed over the center of substrate 110.

A controller 440 coupled (shown as a dot-dashed line) to various components of material removal system 400 (such as substrate holder 105, motor 412, vacuum pump 424, electron emitter 426, and so on) or sensors or metrology tools (e.g., sensors or metrology tools located in chamber 402, substrate holder 105, motor 412, vacuum pump 424, electron emitter 426, and so on) is capable of measuring an operating variable, such as temperature, amount of vaporized material, amount of unvaporized material, etc., to adjust the electron beam parameters (e.g., beam energy, beam current, beamwidth, exposure, etc.), substrate rotation rate, and so forth, to help control the material removal process.

As an example, controller 440 detects that the temperature of substrate 110 is high and turns off or reduces the beam energy and beam current of the electron beam, increases the rotation rate, and so on, to help protect substrate 110 from overheating. As another example, controller 440 utilizes metrology data (e.g., metrology images (from a camera, for example) of the amount of material in the peripheral region of substrate 110) and adjusts the beam parameters to control the removal of the material from the peripheral region. In this example, controller 440 may use the metrology images to determine the amount of material remaining in the peripheral region of substrate 110 and when the material has been removed, controller 440 halts the emissions from electron emitter 426. In this example, if controller 440 determines that a period of time has elapsed and material remains in the peripheral region of substrate 110, controller 440 may adjust the beam parameters to accelerate the rate at which the material is being vaporized. In addition to temperature and image metrology data, controller 440 may be able to detect the presence or absence of vaporized material 428 entrained in gas 420 to make adjustments to the beam parameters.

In an embodiment, to provide electrostatic protection, chamber 402 may be electrically grounded. Similarly, electron emitter 426 may be electrically grounded. Furthermore, protection from X-rays produced by electron emitter 426, X-ray shielding may be installed in chamber 402 and around substrate 110.

FIG. 8A illustrates a top view of a first example chamber 800 of material removal system 700 according to example embodiments presented herein. Chamber 800 includes an outlet 422 located near the edge of substrate 110 to collect gas 420 and vaporized material 428 to prevent vaporized material 428 from depositing on the working surface of substrate 110. As shown in FIG. 8A, outlet 422 is located near electron emitter 426 to enhance collection of vaporized material 428 where it is formed. Although only one outlet 422 is shown in FIG. 8A, greater numbers of outlets 422 are possible.

FIG. 8B illustrates a top view of a second example chamber 850 of material removal system 700 according to example embodiments presented herein. Chamber 850 includes an outlet 422 located the edge of substrate 110 to collect gas 420 and vaporized material 428 to prevent vaporized material 428 from depositing on the working surface of substrate 110. The collection of gas 420 and vaporized material 428 is enhanced by shield 855 that forms a barrier around a portion of substrate 110 to help direct gas 420 and vaporized material 428 into outlet 422. Although only one outlet 422 is shown in FIG. 8B, greater numbers of outlets 422 are possible. Furthermore, shield 855 is shown as fully a portion of substrate 110, embodiments where shield 855 enclosing different portions of substrate 110 are possible.

FIG. 9 illustrates a flow diagram of example process 900 occurring in removing material from a peripheral edge of a substrate using an electron beam in accordance with example embodiments presented herein. Process 900 may be indicative of operations occurring in a material removal system as the material removal system removes material from a peripheral edge of a substrate using an electron beam.

Process 900 begins with the material removal system receiving a substrate (block 905). The substrate may be placed in a substrate holder configured to rotate the substrate at a rotation rate. In an embodiment, the electron emitter is aligned so that the electron beam emitted by the electron emitter is precisely located on the peripheral region of the substrate. The substrate rotation is started (block 907). The substrate, held in the substrate holder, is rotated by the substrate holder. The airflow system, the exhaust system, and the electron emitter are turned on (block 909). The airflow system and the exhaust system, which may include a showerhead or a gas inlet, along with outlets, provide airflow, at a particular flow rate, over the surface of the wafer to evacuate vaporized material produced by the electron beam and prevent the deposition of the vaporized material on the substrate or the material removal system. The electron emitter is configured to produce the electron beam having a beam energy and a beam current. The electron beam also has an exposure, which is dependent on the material being removed from the substrate. The electron beam has a beam type, and may be pulsed or continuous, for example. The rotation of the substrate may commence before the airflow system, the exhaust system, and the electron emitter are turned on to allow the substrate to reach the specified rotation rate. In an embodiment, the airflow system and the exhaust system are turned on before the electron emitter is turned on to help ensure that sufficient airflow exists to entrain vaporized material prior to the material vaporization commences. In other words, the flow rate of the airflow is sufficient to entrain the vaporized material. In an embodiment, the airflow system and the exhaust system are on continually while the material removal system is in operation.

The material removal system (e.g., the controller thereof) performs a check to determine if a stop threshold is met (block 911). The stop threshold specifies when the electron beam is turned off, for example. The stop threshold may be specified in terms of the electron beam exposure, for example. The material removal system may check to determine if the material to be removed has been exposed to the electron beam for a specified electron beam exposure. The stop threshold may be a time duration (such as the time that the electron emitter has been turned on), a number of revolutions of the substrate (e.g., a count of the revolutions of the substrate since the electron emitter has been turned on), and so on. The stop threshold may be specified in accordance with metrology data (such as metrology images, temperature readings, vaporized material sensor data, and so on), for example. As an example, metrology images are used by the controller of the material removal system to determine if the material to be removed has indeed been removed. For example, once the material has been removed, the stop threshold has been met. As another example, temperature readings are used by the controller to control the electron beam emitted by the electron emitter. For example, if the temperature readings indicate the substrate getting overheated, the controller may adjust the beam parameters or turn off the beam to prevent the substrate from being overheated. The stop threshold may be specified as a combination of the specified electron beam exposure and metrology data, for example.

If the stop threshold has not been met, the material removal system continues to check until the stop threshold has been met while material is being removed from the peripheral region of the substrate.

If the stop threshold has been met in block 911, the material removal system turns off the airflow system, the exhaust system, and the electron emitter (block 913). The electron emitter may be turned off before the airflow and exhaust systems to help ensure that any remaining vaporized material is removed. In an embodiment, the airflow and exhaust systems remain on while the material removal system is in operation. The material removal system stops the substrate rotation (block 915) and removes the substrate from the substrate holder (block 917). The substrate may be further processed, in the same or different processing tool.

In an embodiment, where the material removal occurs in the spin-coating station, the material removal process may occur after the spin-coat material has been applied on the substrate. An amount of time may be allowed to elapse to permit the spin-coat material to at least partially set before the material removal process commences. In an embodiment, the exhaust system remains on during the spin-coat process, but the airflow system may be turned off because the airflow may distort the film of spin-coat material. In an embodiment, the exhaust system and the airflow system are both turned off during the spin-coat process. In an embodiment, where the material removal occurs in the spin-coating station, the substrate is moved to a baking station after the spin-coat material has been applied on the substrate. After baking to cure the spin-coat material, the substrate is moved back to the spin-coating station for material removal.

Example 1. A substrate processing system including: a processing chamber; a substrate holder disposed in the processing chamber, the substrate holder configured to hold and rotate a substrate about an axis perpendicular to a working surface of the substrate; an electron emitter adapted to emit a first electron beam directed at a first surface of a peripheral region of the substrate, the first electron beam having a first beam energy and a first beam current sufficient to vaporize material from the first surface of the peripheral region of the substrate; an airflow system configured to direct a flow of gas across the working surface of the substrate; and an exhaust system configured to collect the gas including the material vaporized from the peripheral region.

Example 2. The substrate processing system of example 1, further including a nozzle adapted to dispense the material in a fluid form onto the working surface of the substrate held and rotated by the substrate holder to form a spin-coated film on the working surface of the substrate.

Example 3. The substrate processing system of one of examples 1 or 2, where the first beam energy is between 2 KeV and 20 KeV, and the first beam current is between 1 mA and 30 mA.

Example 4. The substrate processing system of one of examples 1 to 3, where the electron emitter is further adapted to emit a second electron beam directed at the first surface of the peripheral region of the substrate, the second electron beam having a second beam energy and a second beam current sufficient to vaporize the material from a second surface of the peripheral region of the substrate, the second surface opposite the first surface.

Example 5. The substrate processing system of one of examples 1 to 4, where the second beam energy is between 50 KeV and 100 KeV, and the second beam current is between 1 mA and 30 mA.

Example 6. The substrate processing system of one of examples 1 to 5, where the substrate holder is configured to rotate the substrate between 500 RPM and 3000 RPM.

Example 7. The substrate processing system of one of examples 1 to 6, where the electron emitter emits the first electron beam for a duration corresponding to between 2 revolutions and 50 revolutions of the substrate.

Example 8. The substrate processing system of one of examples 1 to 7, where the airflow system includes a showerhead configured to direct the flow of gas substantially across an entirety of the working surface of the substrate toward the exhaust system.

Example 9. The substrate processing system of one of examples 1 to 8, where the airflow system includes a gas nozzle oriented toward the electron emitter, the gas nozzle configured to direct the flow of gas across a portion of the working surface of the substrate toward the electron emitter and the exhaust system.

Example 10. The substrate processing system of one of examples 1 to 9, further including a controller configured to adjust a parameter of the first electron beam in accordance with metrology data associated with the substrate.

Example 11. A method for processing a substrate, the method including: receiving the substrate in a substrate holder of a processing chamber; rotating the substrate about an axis perpendicular to a working surface of the substrate; turning on an airflow system to direct a flow of gas across the working surface of the substrate; and exposing a peripheral region of the substrate to a first electron beam to vaporize material from the peripheral region of the substrate.

Example 12. The method of example 11, where the flow of gas having a flow rate sufficient to prevent deposition of the vaporized material on the working surface of the substrate.

Example 13. The method of one of examples 11 or 12, where the first electron beam having a first beam energy between 2 KeV and 20 KeV, and a first beam current between 1 mA and 30 mA.

Example 14. The method of one of examples 11 to 13, further including exposing the peripheral region of the substrate to a second electron beam to vaporize the material from the peripheral region of the substrate, where the second electron beam has a second beam energy between 50 KeV and 100 KeV, and a second beam current between 1 mA and 30 mA.

Example 15. The method of one of examples 11 to 14, where the flow of gas is directed substantially across an entirety of the working surface of the substrate.

Example 16. The method of one of examples 11 to 15, where the substrate is rotated between 500 RPM and 3000 RPM.

Example 17. A method for processing a substrate, the method including: receiving the substrate; flowing gas across a working surface of the substrate, the gas flowing at a specified flow rate; while rotating the substrate about an axis perpendicular to the working surface of the substrate, vaporizing a portion of a material in a peripheral region of the substrate by exposing the peripheral region to an electron beam from an electron emitter; and determining that a stop threshold is met, and based thereon, turning off the electron emitter.

Example 18. The method of example 17, where the stop threshold is based on a number of rotations of the substrate.

Example 19. The method of one of examples 17 or 18, where the stop threshold is based on metrology data.

Example 20. The method of one of examples 17 to 19, where the specified flow rate is based on a flow rate sufficient to prevent deposition of vaporized material on the working surface of the substrate.

In the preceding description, specific details have been set forth, such as a particular geometry of a processing system and descriptions of various components and processes used therein. It should be understood, however, that techniques herein may be practiced in other embodiments that depart from these specific details, and that such details are for purposes of explanation and not limitation. Embodiments disclosed herein have been described with reference to the accompanying drawings. Similarly, for purposes of explanation, specific numbers, materials, and configurations have been set forth in order to provide a thorough understanding. Nevertheless, embodiments may be practiced without such specific details. Components having substantially the same functional constructions are denoted by like reference characters, and thus any redundant descriptions may be omitted.

Various techniques have been described as multiple discrete operations to assist in understanding the various embodiments. The order of description should not be construed as implying that these operations are necessarily order dependent. Indeed, these operations need not be performed in the order of presentation. Operations described may be performed in a different order than the described embodiment. Various additional operations may be performed or described operations may be omitted in additional embodiments.

"Substrate" as used herein generically refers to an object being processed in accordance with the invention. The substrate may include any material portion or structure of a device, particularly a semiconductor or other electronics device, and may, for example, be a base substrate structure, such as a semiconductor wafer, reticle, or a layer on or overlying a base substrate structure such as a thin film. Thus, substrate is not limited to any particular base structure, underlying layer or overlying layer, patterned or un-patterned, but rather, is contemplated to include any such layer or base structure, and any combination of layers or base structures. The description may reference particular types of substrates, but this is for illustrative purposes only.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A method for processing a substrate, the method comprising:
   receiving the substrate in a substrate holder of a processing chamber;
   rotating the substrate about an axis perpendicular to a working surface of the substrate;
   turning on an airflow system to direct a flow of gas across the working surface of the substrate; and
   exposing a peripheral region of the substrate to a first electron beam to vaporize material from the peripheral region of the substrate, the first electron beam being a pulsed beam of electrons, the first electron beam passing through a metallic foil before vaporizing the material from the peripheral region.

2. The method of claim 1, wherein the flow of gas having a flow rate sufficient to prevent deposition of the vaporized material on the working surface of the substrate.

3. The method of claim 1, wherein the first electron beam having a first beam energy between 2 KeV and 20 KeV, and a first beam current between 1 mA and 30 mA.

4. The method of claim 1, further comprising exposing the peripheral region of the substrate to a second electron beam to vaporize the material from the peripheral region of the substrate, wherein the second electron beam has a second beam energy between 50 KeV and 100 KeV, and a second beam current between 1 mA and 30 mA.

5. The method of claim 1, wherein the flow of gas is directed substantially across an entirety of the working surface of the substrate.

6. The method of claim 1, wherein the substrate is rotated between 500 RPM and 3000 RPM.

7. A method for processing a substrate, the method comprising:

receiving the substrate;

flowing gas across a working surface of the substrate, the gas flowing at a specified flow rate;

while rotating the substrate about an axis perpendicular to the working surface of the substrate, vaporizing a portion of a material in a peripheral region of the substrate by exposing the peripheral region to an electron beam from an electron emitter, the electron beam passing through a metallic foil before contacting the peripheral region; and determining that a stop threshold is met, and based thereon, turning off the electron emitter.

8. The method of claim 7, wherein the stop threshold is based on a number of rotations of the substrate.

9. The method of claim 7, wherein the stop threshold is based on metrology data.

10. The method of claim 7, wherein the specified flow rate is based on a flow rate sufficient to prevent deposition of vaporized material on the working surface of the substrate.

11. A method for processing a substrate, the method comprising:

placing the substrate in a substrate holder, the substrate holder configured to rotate the substrate about an axis perpendicular to a working surface of the substrate;

aligning an electron emitter with a peripheral region of the substrate;

starting a rotation of the substrate with the substrate holder;

turning on an airflow system, an exhaust system, and the electron emitter, wherein the activated electron emitter vaporizes material from a first surface of the peripheral region of the substrate with a first electron beam, the first electron beam being passed through a metallic foil;

making adjustments to beam parameters of the first electron beam based on a presence of vaporized material from the first surface of the peripheral region, the vaporized material being entrained in a gas from the airflow system; and when a stop threshold is met, turning off the airflow system, the exhaust system, and the electron emitter.

12. The method of claim 11, wherein the airflow system is configured to direct a flow of gas across the working surface of the substrate.

13. The method of claim 11, wherein the exhaust system is configured to collect gas comprising the material vaporized from the peripheral region.

14. The method of claim 11, wherein the first electron beam has a first beam energy between 2 KeV and 20 KeV and a first beam current between 1 mA and 30 mA.

15. The method of claim 11, wherein the activated electron emitter produces a second electron beam directed at the first surface of the peripheral region of the substrate, the second electron beam having a second beam energy and a second beam current sufficient to vaporize the material from a second surface of the peripheral region of the substrate, the second surface opposite the first surface.

16. The method of claim 15, wherein the second beam energy is between 50 KeV and 100 KeV and the second beam current is between 1 mA and 30 mA.

17. The method of claim 11, wherein the substrate holder rotates the substrate at a rotation rate between 500 RPM and 3000 RPM.

18. The method of claim 11, wherein the electron emitter emits the first electron beam for a duration corresponding to between 2 revolutions and 50 revolutions of the substrate.

19. The method of claim 11, further comprising adjusting a parameter of the first electron beam in accordance with metrology data associated with the substrate.

20. The method of claim 19, wherein the metrology data comprises images of a remaining amount of the material in the peripheral region of the substrate.

* * * * *